United States Patent
Asadi et al.

(10) Patent No.: US 11,381,253 B1
(45) Date of Patent: Jul. 5, 2022

(54) DECODING CODEWORD BASED ON HIGHER ORDER INFORMATION

(71) Applicant: SK hynix Inc., Icheon-si (KR)

(72) Inventors: Meysam Asadi, Fremont, CA (US); Fan Zhang, Fremont, CA (US); Aman Bhatia, Los Gatos, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/169,237

(22) Filed: Feb. 5, 2021

(51) Int. Cl.
*H03M 13/11* (2006.01)
*H03M 13/09* (2006.01)

(52) U.S. Cl.
CPC ..... *H03M 13/1108* (2013.01); *H03M 13/096* (2013.01); *H03M 13/1148* (2013.01)

(58) Field of Classification Search
CPC ......... H03M 13/1108; H03M 13/1148; H03M 13/096
See application file for complete search history.

(56) References Cited

U.S. PATENT DOCUMENTS

| | | |
|---|---|---|
| 2010/0042806 A1 | 2/2010 | Gunnam |
| 2011/0246862 A1 | 10/2011 | Graef |
| 2017/0134049 A1 | 5/2017 | Hsiao et al. |
| 2018/0113760 A1* | 4/2018 | Bhatia ................ H03M 13/1108 |
| 2018/0159559 A1 | 6/2018 | Bazarsky et al. |
| 2018/0343017 A1* | 11/2018 | Kumar .............. H03M 13/6597 |
| 2019/0238158 A1* | 8/2019 | Bhatia .................... G11C 29/52 |
| 2020/0127687 A1 | 4/2020 | Sharon et al. |
| 2020/0389186 A1 | 12/2020 | Kim |

OTHER PUBLICATIONS

Rejoy Roy Mathews, "Decoding LDPC Codes with Probabilistic Local Maximum Likelihood Bit Flipping", Thesis, Electrical and Computer Engineering, Available Online at: https://digitalcommons.usu.edu/cgi/viewcontent.cgi? article=8860&context=etd, 2020, 67 pages.

* cited by examiner

*Primary Examiner* — Thien Nguyen
(74) *Attorney, Agent, or Firm* — Weaver Austin Villeneuve & Sampson LLP

(57) ABSTRACT

Techniques related to improving the decoding performance of codewords, such as LDPC codewords, are described. In an example, the error-correction capability of a decoding layer is improved, where the improvements may include lowering the error floor. To do so, higher order information is used in the decoding. Higher order information refers to, during the decoding of a variable node that is in error, using information that is not limited to the variable node and check nodes connected thereto, but includes information related to variable nodes that are also in error and connected to the variable node via satisfied check nodes and related to unsatisfied check nodes connected to such variable nodes.

20 Claims, 9 Drawing Sheets

$$200 \searrow \quad H = \begin{bmatrix} 1 & 0 & 1 & 0 & 0 & 1 \\ 1 & 1 & 0 & 0 & 1 & 0 \\ 1 & 0 & 0 & 1 & 0 & 0 \\ 0 & 1 & 0 & 1 & 0 & 1 \end{bmatrix}$$

Variable Nodes    Check Nodes

DECODING CODEWORD BASED ON HIGHER ORDER INFORMATION

BACKGROUND

Error-correction codes (ECCs) are typically used for various types of data storage devices, including NAND flash memories. ECCs are also frequently used during the process of data transmission. ECC refers to codes that add redundant data, or parity data, to a message, such that the message can be recovered by a receiver even when a number of errors were introduced, either during the process of transmission or in storage. In general, the ECC can correct the errors up to the capability of the code being used. ECC decoding can include soft decoding, such as low-density parity-check code (LDPC) decoding, where a logical value stored in a memory cell can be represented as a probability distribution.

In many decoding systems, different types of decoders can be used, each of which has a different error-correction capability. For example, in LDPC decoding, a bit-flipping (BF) can be implemented in the first decoding layer that handles the majority of read traffic. A min-sum (MS) decoder can be implemented in a deeper decoding layer that handles a smaller portion of the read traffic that the BF decoder did not properly decode. Although the decoding capability of the BF decoder is weaker than the MS decoder, BF is used due to having much lower decoding latency at very high signal to noise ratio (SNR) regime. In such systems, most of the code design techniques focus on increasing correction capability of the deeper layers of the defense flow, such as that of the MS decoder.

BRIEF SUMMARY

Techniques related to improving the decoding performance of codewords, such as LDPC codewords, are described. In an example, the error-correction capability of a decoding layer, such as a first decoding layer of a multi-decoding layer system, is improved. The improvements may include lowering the error floor, thereby enabling this decoding layer to decode codewords for which otherwise the decoding would have failed. To do so, higher order information is used in the decoding. Higher order information refers to during the decoding of a variable node that is in error the use of information that is not limited to the variable node and check nodes connected thereto but that includes information related to variable nodes that are also in error and connected to the variable node via satisfied check nodes and related to unsatisfied check nodes connected to such variable nodes.

In an example, a method of decoding an LDPC codeword is disclosed. The method is implemented by a computer system and includes determining, for a first variable node, a first set of check nodes that are connected to the first variable node and that are satisfied and a second set of check nodes that are connected to the first variable node and that are unsatisfied, wherein the first variable node represents at least one bit of the LDPC codeword and is in error, determining, for the first variable node, a second variable node that is in error, connected to the first variable node via a check node of the first set, and at least two edges away from the first variable node, determining a third set of check nodes that are connected to the second variable node and that are unsatisfied, determining whether the at least one bit represented by the first variable node is to be flipped based on the second set and the third set, and decoding the LDPC codeword based on the determination of whether the at least one bit is to be flipped.

In an example, the method further includes determining, in a decoding iteration, a checksum associated with the first variable node, where the third set is determined based on a value of the checksum. In this example, the method can further include, in another decoding iteration: determining an updated value of the checksum, omitting the determination of the second variable node based on the updated value, determining an updated second set of check nodes that are connected to the first variable node and that are unsatisfied, determining whether the at least one bit represented by the first variable node is to be flipped based on the updated second set and independently of the third set, and decoding the LDPC codeword based on the determination of whether the at least one bit is to be flipped in the other decoding iteration.

In an example, determining whether the at least one bit is to be flipped includes determining a total number of unsatisfied check nodes based on a size of the second set and a size of the third set, and comparing the total number to a threshold. In this example, the threshold can be defined based on a degree of the first variable node, and determining whether the at least one bit is to be flipped can include determining that the at least one bit is to be flipped based on the total number being larger than the threshold.

In an example, determining whether the at least one bit is to be flipped includes, in a decoding iteration: determining a first energy $E_v^{(l>1)}$ of the first variable node, where: the first energy $E_v^{(l>1)}$ is equal to $$\sum_{i=0}^{deg_v} g(c_i^{(1)}, C_i^{(l>1)});$$

$deg_v$ is a degree of the first variable node; $c_i^{(1)}$ is a check node from the second set that has an index i; $C_i^{(l>1)}$ is a fourth set of check nodes that are unsatisfied, that are at least l edges away from the first variable node, and wherein each is connected to a variable node from a set $S_v^{(l-1)}$ of variable nodes; l is at least three; the set $S_v^{(l-1)}$ comprises variable nodes that are in error and that are at least l–1 edges away from the first variable node; and $g(c_i^{(1)}, C_i^{(l)})=\text{NOT}(c_i^{(1)})$ AND $(\text{OR}(C_i^l)$; updating an energy $E_v$ of the first variable node based on the first energy $E_v^{(l>1)}$, and comparing the energy $E_v$ to a threshold, wherein the threshold is defined based on a degree of the first variable node. In this example, the method can also include, in another decoding iteration, determining whether the at least one bit is to be flipped by at least: determining, instead of the first energy $E_v^{(l>1)}$, a second energy $E_v^{(l=1)}$ of the first variable node, wherein the energy $E_v$ is equal to the second energy $E_v^{(l=1)}$; and comparing the energy $E_v$ to the threshold. Further, the second energy $E_v^{(l=1)}$ is computed instead of the first energy $E_v^{(l>1)}$ based on a checksum associated with the first variable node.

In an example, a computer system is disclosed. The computer system includes a memory storing an LDPC codeword, and an LDPC decoder coupled with the memory and configured to perform the examples of the method described herein above.

In an example, a non-transitory computer-readable storage medium is disclosed. The non-transitory computer-readable storage medium stores instructions that, upon execution on a computer system, cause the computer system to perform operations of the examples of the method described herein above.

Consider the following illustrative example. A conventional BF decoder uses a message-passing algorithm to pass messages between variable nodes and check nodes in order to decode an LDPC codeword. A decision is made to flip bit(s) represented by a variable node that is in error (e.g., that is connected to a check node that is unsatisfied such as by having a parity-check equation not equal to zero). The decision depends on the degree of the variable node (e.g., how many check nodes are connected to it) and the energy of the variable node (e.g., how many of the connected check nodes are unsatisfied). For example, when the energy is larger than half of the degree, the decision is to flip the bit(s). The conventional BF decoder suffers from a trapping issue: upon the error floor approaching a particular code failure rate (CFR), the energy of a variable node may not change much across additional decoding iterations and, therefore, no additional bit flipping decisions can be meaningfully made by performing the additional decoding iterations.

In contrast thereto, a BF decoder of the present disclosure overcomes the trapping issue. In particular, the energy computed to a variable node is not limited to the variable node only, but it can also account for the energy of other variable nodes that are in error and that are indirectly connected to the variable node.

For instance, a first variable node is connected to five check nodes, two of which are unsatisfied. The degree and energy of this first variable node are five and two, respectively. One of the satisfied check nodes is connected to a second variable node that is in error. The energy of this second variable node is one. The two energies are summed, resulting in a total energy of three, where this total energy is associated with the first variable node. Because the total energy is larger than half of the degree (e.g., larger than 2.5), a decision is made to flip the bit(s) represented by the first variable node. If the conventional BF decoder was used, the energy of the first variable node is two and is smaller than half of the degree, and, thus, the decision would be not flip the bit(s).

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE DRAWINGS

An understanding of the nature and advantages of various embodiments may be realized by reference to the following figures.

DETAILED DESCRIPTION

Figure 1:
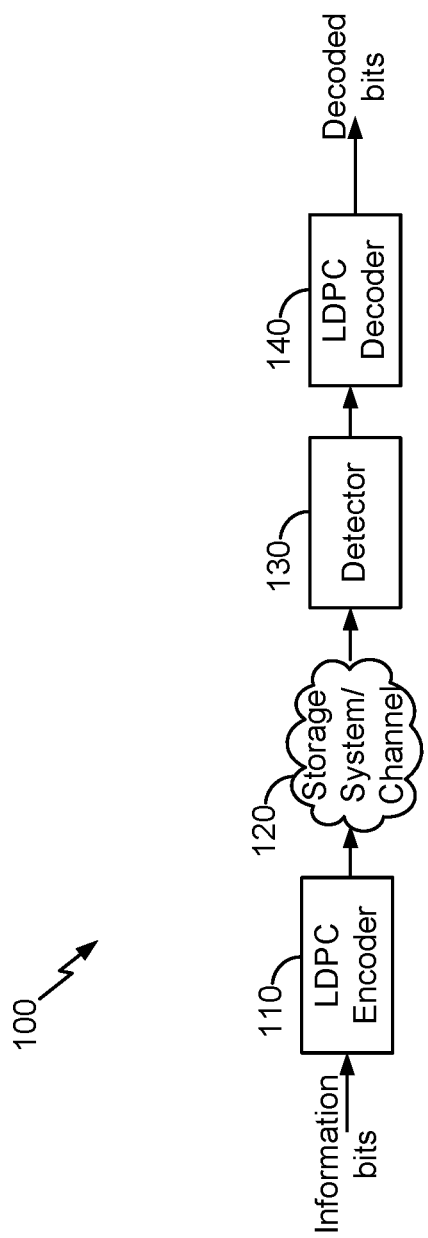
FIG. 1 illustrates an example high-level block diagram of an error-correcting system, in accordance with certain embodiments of the present disclosure.

Techniques related to improving the decoding performance of codewords, such as LDPC codewords, are described. In an example, the decoding uses a message-passing algorithm, such as a bit-flipping (BF) algorithm, that iteratively passes information between variable nodes and check nodes. In conventional systems, after a number of decoding iterations of a codeword, the message-passing algorithm may not determine additional information useful to decode the codeword and the decoding may fail even when a maximum number of iterations is reached. In such situations, the decoding may be referred to as being trapped and the additional decoding iteration may be performed unnecessarily, resulting in a decoding latency and power consumption waster without a decoding gain. In contrast, the present disclosure proposes a decoding system that intelligently and selectively determines higher order information during the decoding. In particular, the message-passing algorithm of the disclosed decoding system can determine, for a variable node that is in error, information that is not limited to the variable node and check nodes connected thereto but that includes information related to variable nodes that are also in error and connected to the variable node via satisfied check nodes and related to unsatisfied check nodes connected to such variable nodes. This information is used in the decoding of the variable node.

To illustrate, consider an example of a BF decoder. Generally, the BF decoder determines whether to flip a bit represented by a first variable node. In conventional systems, the bit-flip decision is based on lower order information. That is the information based on only the check nodes that are directly connected to the first variable node. In particular, the degree of the first variable node is determined (e.g., the number of directly connected check nodes). The number of the unsatisfied check nodes connected to the first variable node is also determined. If the number is larger than half of the degree, the BF decoder flips the bit. Otherwise, the bit is not flipped. In such conventional system, trapping can occur, where the first variable node is in error and the number of the unsatisfied check nodes remains smaller than half of the degree across multiple decoding iterations. This trapping is further described in the figure below. As such, the conventional BF decoder continues to perform decoding iterations without gaining useful information to determine whether the bit is to be flipped or not.

In comparison, a BF decoder of the present disclosure can avoid the trapping. In particular, the BF decoder can consider a satisfied check node that is directly connected to the first variable node. Next, the BF decoder determines a second variable node that is in error and that is connected to the satisfied check node (e.g., the second variable node is indirectly connected to the first variable node via the satisfied check node). In this illustration, the second variable node is at a distance of two from the first variable node (e.g., connected to the first variable node indirectly along two edges). For the second variable node, the BF decoder determines the number of unsatisfied check nodes connected thereto. This number is used, along with the number of unsatisfied check nodes directly connected to the first variable node, to determine whether to flip the bit represented by the first variable node. The number of unsatisfied check nodes connected to the second variable node is an example of higher order information about the first variable node because this information relates to a second variable node and a check node that are indirectly connected to the first variable node. The higher order information need not be limited to only the second variable node but, depending on the actual decoding, can include one or more variable nodes that are at least two edges away from the first variable node (e.g., at least at a distance of two) and one or more check nodes that are at least three edges away from the first variable node (e.g., at least at a distance of three).

By avoiding the trapping, multiple technological improvements are achieved. For example, the higher order information improves the performance of the message-passing algorithm implemented in a decoder, whereby the error floor of the decoding is lowered. When such a decoder is implemented in a decoding layer of a multi-layer decoding system, the overall decoding latency of this system can be improved, resulting in an improved quality of service (QoS) because a relatively larger amount of the read traffic can be successfully decoded in the decoding layer and thus a deeper, more complex decoding layer is not needed. When such a decoder is implemented in a single-layer decoding system, the throughput and decoding latency can be improved because of the increased error-correction capability of the decoder.

In the interest of clarity of explanation, various embodiments of the present disclosure are described in connection with LDPC decoding that uses a BF decoding. Nonetheless, the embodiments can similarly apply to other decoder types that rely on a message-passing algorithm. In addition, various embodiments of the present disclosure are described in connection with quasi-cyclic LPDC (QC-LDPC) codes. Nonetheless, the embodiments can similarly apply to other code types, including other types of LDPC codes.

FIG. 1 illustrates an example of a high-level block diagram of an error-correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much lower than its dimension. The term "column weight" is used herein to refer to the number of non-zero values in a specific column of the parity-check matrix H. The term "row weight" is used herein to refer to the number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from the other column weights. Usually, irregular LDPC codes provide better error-correction capability than regular LDPC codes.

The LDPC codes are also described according to the way they are constructed. Code construction can use a density evolution (DE) scheme to create a sparse parity-check matrix with a targeted distribution. Random computer searches or algebraic constructions are possible. The random computer search construction describes an LDPC code having a parity-check matrix designed by a random computer-based procedure. Algebraic construction implies that the parity-check matrix has been constructed based on combinatorial methods. QC-LDPC codes fall under the latter construction method. One advantage of QC-LDPC codes is that they have a relatively easier implementation in terms of the encoding procedure. The main feature of QC-LDPC codes is that the parity-check matrix consists of circulant submatrices, which could be based on either an identity matrix or a smaller random matrix. Permutation vectors could also be used create the circulant submatrices.

As illustrated, an LDPC encoder 110 receives information bits that include data that is desired to be stored in a storage system 120. LDPC-encoded data is output by the LDPC encoder 110 and is written to the storage 120.

In various embodiments, the storage 120 may include a variety of storage types or media such as magnetic, solid-state, disk-drive, or flash storage. In some embodiments, the techniques are employed in a transceiver, and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit (e.g., a logical value of "1" or "0"). On the other hand, a hard output detector outputs a decision on each bit without providing corresponding reliability information. As an example, a hard output detector may output a decision that a particular bit is a "1" or a "0" without indicating how certain the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how certain the detector is in that decision (e.g., a large magnitude indicates a high reliability or certainty).

The decision and/or reliability information is passed to an LDPC decoder 140, which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques, including an application-specific integrated circuit (ASIC), a field-programmable gate array (FPGA), and/or a general-purpose processor (e.g., an Advanced RISC Machine (ARM) core).

LDPC codes are usually represented by bipartite graphs. One set of nodes, for example, the variable or bit nodes, corresponds to elements of the codeword, and the other set of nodes, for example, check nodes, corresponds to the set of parity-check constraints satisfied by the codeword. Typically the edge connections are chosen at random. The error-correction capability of an LDPC code is improved if cycles of short length are avoided in the graph. In a (r, c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly, the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

Figures 2A, 2B:
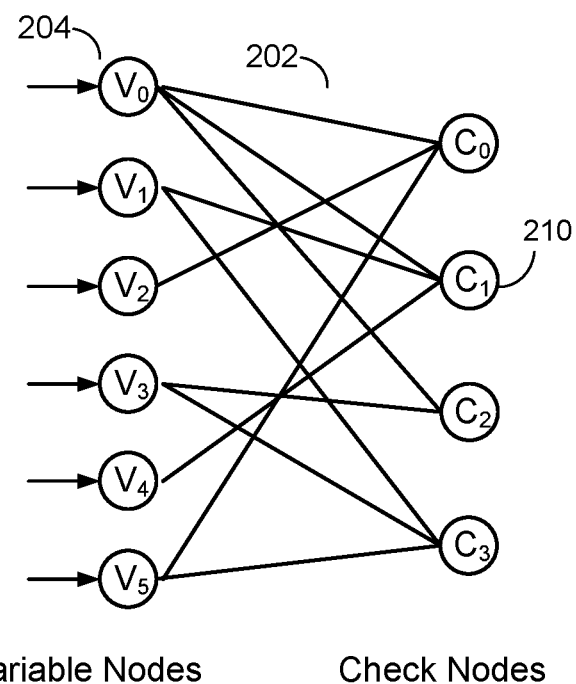
FIGS. 2A-2B illustrate an example parity-check matrix and an example graph representing the parity-check matrix, in accordance with certain embodiments of the present disclosure.

FIG. 2A illustrates an example parity-check matrix H 200, and FIG. 2B illustrates an example bipartite graph corresponding to the parity-check matrix 200. In this example, the parity-check matrix 200 has six column vectors and four row vectors, although embodiments of the present disclosure are not limited as such and can similarly be applied to a parity-check matrix with hundreds if not thousands of column vectors and row vectors. Network 202 shows the network corresponding to the parity-check matrix 200 and represents a bipartite graph. Various type of bipartite graphs are possible, including, for example, a Tanner graph.

Generally, the variable nodes in the network 202 correspond to the column vectors in the parity-check matrix 200. The check nodes in the network 202 correspond to the row vectors of the parity-check matrix 200. The interconnections between the nodes are determined by the values of the parity-check matrix 200. Specifically, a "1" indicates that the corresponding check node and variable nodes have a connection. A "0" indicates that there is no connection. For example, the "1" in the leftmost column vector and the second row vector from the top in the parity-check matrix 200 corresponds to the connection between the variable node 204 and the check node 210.

A message-passing algorithm is generally used to decode LDPC codes. Several variations of the message-passing algorithm exist in the art, such as BF algorithm, an MS algorithm, a scaled MS algorithm, or the like. In general, any of the variations of the message-passing algorithm may be used in an LDPC decoder without departing from the teachings of the present disclosure. Message passing uses a network of variable nodes and check nodes, as shown in FIG. 2B. The connections between variable nodes and check nodes are described by and correspond to the values of the parity-check matrix 200, as shown in FIG. 2A.

A hard-decision message-passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. The response message corresponds to a value that the check node believes that the variable node should have based on the information received from the other variable nodes connected to that check node. This response is calculated using the parity-check equations, which force the values of all the variable nodes that are connected to a particular check node to sum up to zero (modulo 2).

At this point, if all the equations at all the check nodes are satisfied, the decoding algorithm declares that a correct codeword is found, and it terminates. If a correct codeword is not found, the iterations continue with another update from the variable nodes using the messages that they received from the check nodes to decide whether the bit at their position should be a zero or a one by a majority rule. The variable nodes then send this hard-decision message to the check nodes that are connected to them. The iterations continue until a correct codeword is found or a maximum number of iterations are performed without finding a correct codeword. It should be noted that a soft-decision decoder works similarly; however, each of the messages that is passed among check nodes and variable nodes also includes reliability of each bit.

An example message-passing algorithm may be performed. In this example, L(qij) represents a message that is sent by variable node $v_i$ to check node $c_j$; L($r_{ji}$) represents the message sent by check node $c_j$ to variable node $v_i$; and L($c_i$) represents the initial LLR value for each variable node $v_i$.

Variable node processing for each L(qij) can be performed through the following steps:

(1) Read L($c_i$) and L($r_{ji}$) from memory.
(2) Calculate L(Qi–sum)=L($c_i$)+Scaling Factor*$\Sigma_{j' \in c_i}$L($r_{ij}$).
(3) Calculate each L(Qi–sum)–L($r_{ij}$).
(4) Output L(Qi–sum) and write back to memory.
(5) If this is not the last column of the memory, go to Step 1 and increment i by one.
(6) Compute parity-check-sums (e.g., syndrome); if they are all equal to zero, the number of iterations reaches a threshold, and the parity-check-sums are greater than another threshold, or the number of iterations equals a maximum limit, stop; otherwise, perform check node processing.

Check node processing for each L(rji) can be performed as follows:

(7) Read one row of qij from memory.
(8) Calculate L(Rj–sum) as follows:

$$L(Rj-sum) = \left(\prod_{i' \in R_j} \alpha_{i'j}\right) \emptyset\left(\sum_{i' \in R_j} \emptyset(\beta_{i'j})\right)$$

$$\alpha_{ij} = \text{sign}(L(q_{ij})), \beta_{ij} = |L(q_{ij})|,$$

$$\emptyset(x) = -\log\left(\tanh\left(\frac{x}{2}\right)\right) = \log\left(\frac{e^x+1}{e^x-1}\right)$$

(9) Calculate the individual L($r_{ji}$)=($\Pi_{i' \in R_{ji}} \alpha_{i'j}$)$\emptyset$($\Sigma_{i' \in R_{ji}}\emptyset$ ($\beta_{i'j}$)) for check nodes.
(10) Write back L($r_{ji}$) to memory.
(11) If this is not the last row of memory, go to the first step and increment j by one.

Figure 3:
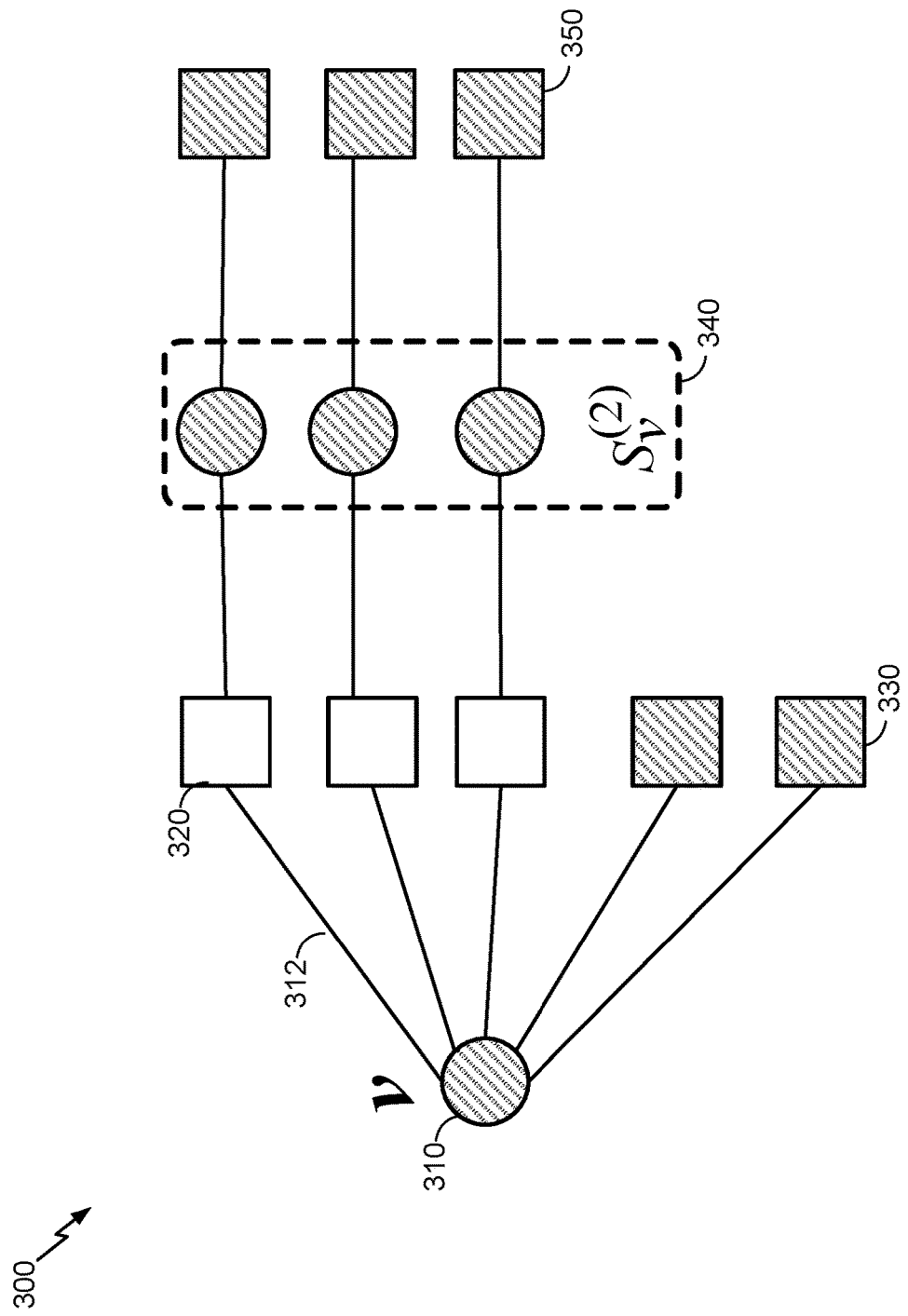
FIG. 3 illustrates an example graph for decoding an LDPC codeword using lower order information.

FIG. 3 illustrates an example graph 300 for decoding an LDPC codeword using lower order information. By using the lower order information only, trapping may occur. "Lower order information" is used to refer to information about a variable node, where this information is available from check nodes that are directly connected to the variable node. "Directly connected" is used to refer to a check node that is at a distance of one from the variable node (e.g., that is connected to the variable node by a single edge between the two). "Distance" is used to refer to the number of edges along a path that connects two nodes.

As illustrated, a variable node 310 is in error and represents at least one bit of an LDPC codeword. It may be in error because at least one of the check nodes connected directly thereto is unsatisfied (e.g., the parity-check equation associated with this check node is not equal to zero). In the illustrative example of FIG. 3, the variable node 310 has a degree of five by being directly connected to five check nodes. The degree is equal to the number of edges 312 connecting the variable node 310 to these check nodes.

Out of the five check nodes, three check nodes 320 are satisfied (e.g., the parity-check equation associated with a check node is equal to zero), as illustrated with a blank box, and the remaining two check nodes 330 are unsatisfied, as illustrated with a dashed box. The total number of unsatisfied check nodes 330 that are directly connected to the variable node 310 is two. This total number can represent a lower order energy of the variable node 310. The lower order energy (e.g., two) can be compared to a threshold, where the threshold may be defined based on the degree of the variable node 310 (e.g., the threshold is equal to half of the degree). When the lower order energy is larger than the threshold, the at least one bit represented by the variable node 310 can be flipped. Otherwise, the bit(s) is(are) not flipped.

Trapping can occur, where the lower order energy may remain unchanged across decoding iterations or, even if updated, may not exceed the threshold and therefore no BF may be performed. The cause behind the trapping can relate to another variable node that is in error and that is indirectly connected to the variable node 310 via a satisfied check node, where this other variable node also has a small lower order energy. In particular, consider the top satisfied check node 330. To its right is a second variable node that is at a distance of two from the first variable node 310 and that is in error (as illustrated with the dashed circle). If the bits represented by these two variable nodes are flipped, the top check node 330 remains satisfied (e.g., in the parity-check equation, and before the BF, a bit of the variable node is "1" and a bit of the other variable node is "0"; by flipping both bits to "0" and "1," respectively, the parity-check equation remains equal to zero). As such, bit trapping may occur when the variable node 310 is in error and has a small lower order energy (e.g., smaller than half of its degree), and when at least a second variable node also has a small lower order energy, where this second variable is in error, at least two edges away from the variable node 310, and connected to the variable 310 via a satisfied check node.

This bit trapping can be generalized as follows. Let $L_{v,w}$ denote the length of the path (number of edges) that connects two variable-nodes v and w. When $L_{v,w}$ is small for failed bits represented by variable nodes v, w, the BF decoder is more likely to fail. This issue could prevent the BF decoder from successfully decoding even when the number of failed bits in the sequence is at middle fail bit count (FBC) range. In such cases, the failed bit represented by the variable node w misleadingly helps to reduce the energy function of the other variable node v and vice versa.

Using the illustration of FIG. 3, let n, m denote the code length and number of parity checks respectively (n, m are very large numbers.) FIG. 3 only shows erroneous variable nodes 310 and 340, and all the check-nodes 320, 330, and 350 connecting to them. $S_v^2$ denotes the set of variable nodes 340 that are in error, that are at a distance of two from the variable node 310, and that are each connected to a stratified check node 320 at a distance of one from the variable node 310. Generally, $S_v^{(l)}$ denotes the set of failed variable nodes w with $L_{v,w}=l \cdot S_v^{(l)} = \{w: L_{v,w}=l, w \text{ is in error}\}$. This set $S_v^{(l)}$ can be called the set of "hidden nodes at distance 1 of the variable node v."

In the illustration, five check nodes out of a total of 320 check nodes are unsatisfied (e.g., two check nodes 330 that are at a distance of one from the variable node 310, and three check nodes 350 that are at a distance of three from the variable node 310). One trapping issue stems from when, for every failed bit represented by a variable node v, there exists at least one variable node w with $L_{v,w}=2$. In this situation, $E_v$ denotes the energy function for a variable node v (e.g., the lower order energy, such as the number of unsatisfied check nodes 330 that are directly connected to the variable node v). For the variable node 310, this $E_v=2$. If the threshold for flipping is $$T_d = \frac{d}{2},$$

the BF decoder does not flip the variable node 310 because $E_v \leq T_d$. When no higher order information is used, the $E_v$ is unlikely to be updated for the variable node 310 after a number of decoding iterations such that $E_v > T_d$ due to the trapping issue.

Figure 4:
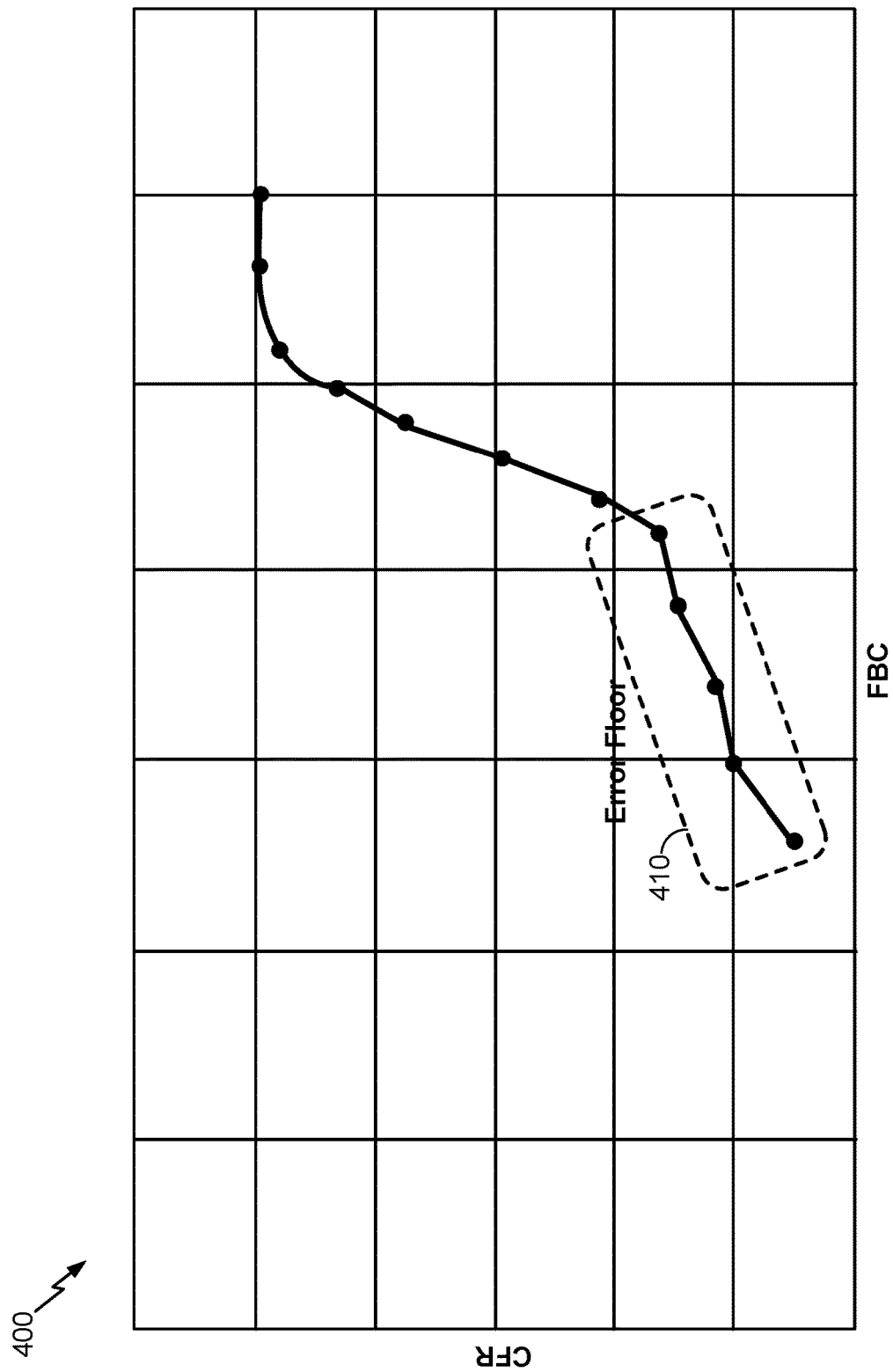
FIG. 4 illustrates an example error floor of a decoder using the lower order information disclosed in connection with FIG. 3.

FIG. 4 illustrates an example error floor 410 of a decoder using the lower order information disclosed in connection with FIG. 3. The plot 400 illustrated in FIG. 4 shows FBC on the horizontal axis and the CFR on the vertical axis and is generated based on a simulation of decoding QC-LDPC codes with a BF decoder that uses, for a variable node, a lower order energy of the variable node in the related BF decision. The error floor 410 occurs starting at CFR close to $10^{-3}$. At this error floor 410, the performance of the BF decoder may degrade, whereby the decoding of QC-LDPC codewords may fail (e.g., at a rate higher than $10^{-3}$) even when the BF decoder uses the maximum number of decoding iterations (which, in turn, increases the decoding latency).

Figure 5:
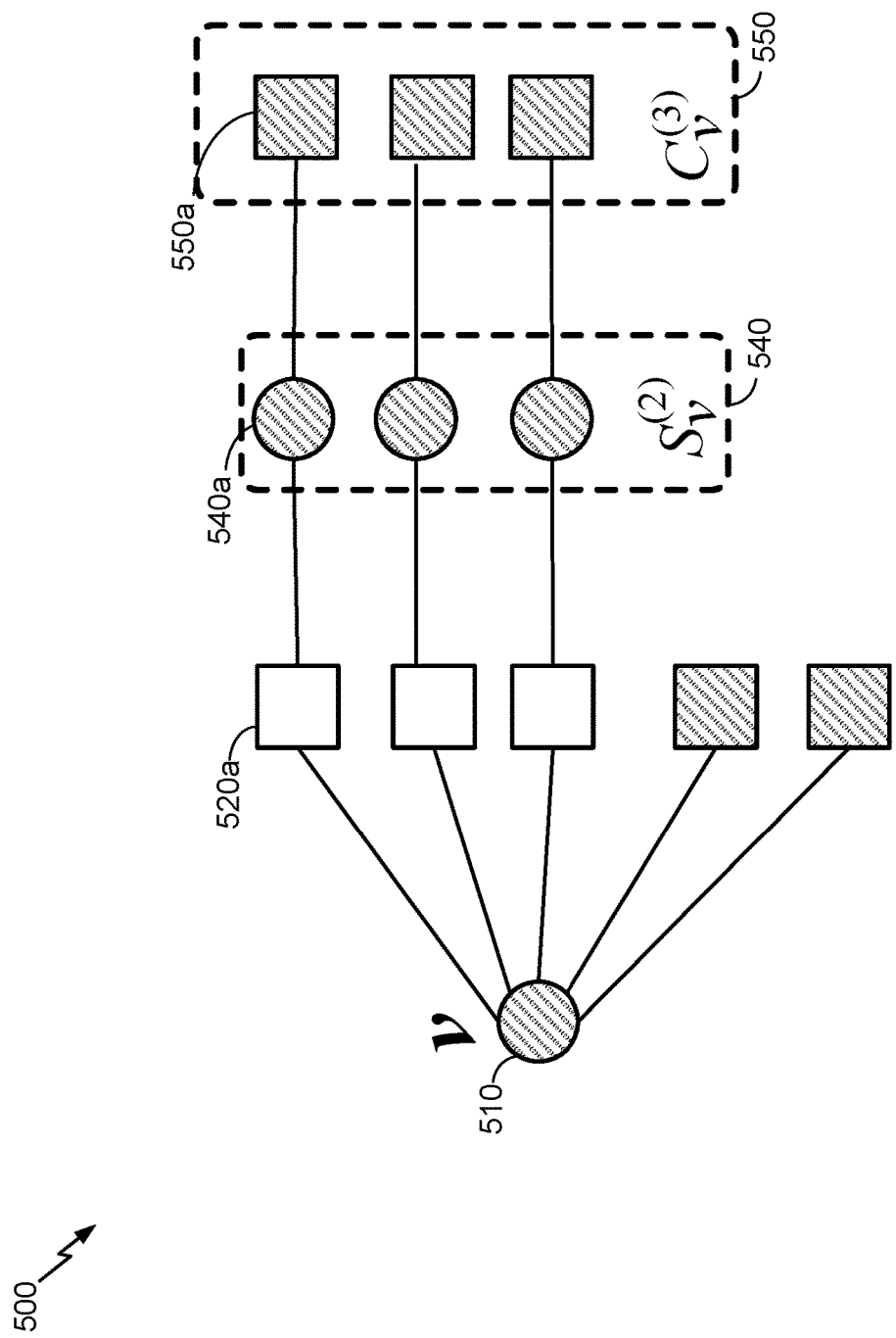
FIG. 5 illustrates an example graph for decoding an LDPC codeword using higher order information.

FIG. 5 illustrates an example graph 500 for decoding an LDPC codeword using higher order information. In the interest of clarity and brevity of explanation, the graph 500 is similar to the graph 300 and the similarities are not repeated herein. A difference is that rather than using lower order information, higher order information is additionally used. The use of the higher order information may overcome the trapping discussed herein above in connection with FIG. 3 and may lower the error floor, as further illustrated in FIG. 6, thereby improving the decoding performance.

"Higher order information" is used to refer to information about a second variable node indirectly connected to a first variable node and/or to information about a check node that is indirectly connected to the first variable node. The higher order information is usable by a message-passing algorithm in the decoding of a codeword having at least one bit represented by the first variable node. "Indirectly connected" is used to refer to a node that is at a distance of two or more from the first variable node. For example, the second variable node can be indirectly connected to the first variable node at a distance of two, four, or another even integer. In comparison, a check node can be indirectly connected to the first variable node at a distance of three, five, or another odd integer greater than one (e.g., a distance of one indicates that the check node is directly connected to the first variable node).

As illustrated, a variable node 510 (e.g., the same or similar to the variable node 310 of FIG. 3) is in error and represents at least one bit of an LDPC codeword. The variable node 510 is directly connected to five check nodes and thus has a degree of five. Three of the five check nodes are satisfied (e.g., the same or similar to the check nodes 320 of FIG. 3) as illustrated with blank boxes. The remaining two check nodes are unsatisfied (e.g., the same or similar to the check nodes 330 of FIG. 3). Thus, the lower order energy of the variable node 510 is two.

Considering a first satisfied check node 520a of the three satisfied check nodes, this check node 520a is also connected to a second variable node 540a that is in error and that is from a set $S_v^{(2)}$ of variable nodes that are in error and are at a distance of two from the variable node 510. In turn, the variable node 540a is connected to the satisfied check node 520a and to an unsatisfied check node 550a from a set $C_v^{(3)}$ of check nodes that are unsatisfied and are at a distance of three from the variable node 510. The variable node 520a has a degree of two and a low order energy of one (by being directly connected to one satisfied check node 520a and one unsatisfied check node 550a). The lower order energy of this indirectly connected variable node 520a is an example of higher order information usable in the BF decision of the variable node 510. For example, the variable node 520a low order energy (e.g., one) can be summed with, or added as a weighted sum to, the variable node's 510 low order energy (e.g., two) to compute a total energy of the variable node 510. The BF decoder can compare the total energy, instead of the variable node's 510 low order energy, to the threshold $T_d$ to decide whether to flip the bit(s) represented by the variable node 510 (e.g., the bit(s) is(are) flipped when the total energy exceeds the threshold $T_d$). Of course, this total energy can be computed using higher order information of the remaining indirectly connected variable nodes from the set $S_v^{(2)}$ (and/or from other sets $S_v^{(l)}$ at even distances l greater than two) and/or of the remaining indirectly connected check nodes from the set $C_v^{(3)}$ (and/or from other sets $C_v^{(l)}$ at odd distances l greater than three). If a weighted sum is used, the weights can be static or dynamic. A static weight can be predefined (e.g., as an inverse or a fraction of the distance l). A dynamic weight can be dynamically computed using one or more factors, including, for example, the distance l of the indirectly connected node, the LLR of the indirectly connected node, and/or the decoding iteration. $deg_v$ is a degree of the first variable node. $c_i^{(1)}$ is a check node from the second set and has an index i. $C_i^{(l>1)}$ is a set of check nodes that are unsatisfied, that are at least l edges away from the first variable node, where each is connected to a variable node from a set $S_v^{(l-1)}$ of variable nodes, and where l is at least three. The set $S_v^{(l-1)}$ includes variable nodes that are in error and that are at least l−1 edges away from the first variable node.

As such, and to overcome the trapping, while a BF decoder is computing the energy function for a variable node v (e.g., the variable node 510), the BF decoder does not have knowledge of the sets $S_v^{l}$ of indirectly connected variable nodes that are in error and that are at even distances l greater than two. However, in some cases, the existence of unsatisfied check nodes at distance l+1 from the variable node v can indicate the presence of hidden states of such variable nodes at distance l (e.g., can indicate the trapping).

Let $C_v^{(l+1)}$ be the set of unsatisfied check-nodes at distance l+1 from the variable node v. In order to help decoder to decode even in the presence of trapping (e.g., as illustrated in FIG. 3), the energy function $E_v$ can be modified for the variable node v by looking into deeper level unsatisfied check nodes ($C_v^{(l\geq 3)}$). FIG. 4 shows $C_v^{(3)}$, which can be used as an indicator for the presence of $S_v^{2}$.

To do so, and unlike the conventional BF decoder that computes the energy function at a distance of only one (e.g., a lower order energy $$E_v^{(l=1)} = \sum_{i=1}^{deg_v} c_i^{(1)},$$

the higher order energy function is used and is expressed as $$E_v^{(l>1)} = \sum_{i=0}^{deg_v} g(c_i^{(1)}, C_i^{(l>1)}). \ g(c_i^{(1)}, C_i^{(l>1)})$$

can be any combinational logic and can include static and/or dynamic weights. The function g can be defined based on observed trapping sets and hardware complexity. An example of the function g is g ($c_i^{(1)}$, $C_i^{(l>1)}$=NOT($c_i^{(1)}$) AND (OR($C_i^{l>1}$)) (e.g., the first part of the equation represents check nodes that are not directly connected to the variable node v should be considered; the second part of the equation represents the number of check nodes that are indirectly connected to the variable node v and that are unsatisfied).

The BF decoder can compute a total energy $E_v$ of the variable node v based on the =1) lower order energy $E_v^{(l=1)}$ and the higher order energy $E_v^{(l>1)}$. For example, the total energy $E_v$ is a sum or weighted sum of the two energies. The BF decoder can also compare the total energy $E_v$ to the threshold $T_d$, and does not flip the bit(s) represented by the variable node v when $E_v \leq T_d$; otherwise, the bit(s) is(are) flipped. In situations where the variable node v represents multiple bits and where a flip decision is made, one or more of such bits can be flipped.

In an optimization of the BF decoder, higher order energies $E_v^{(l>1)}$ may be intelligently and selectively computed, rather than being computed for all variable nodes and at each decoding iteration. For example, for a variable node that is in error and that is directly connected to an unsatisfied check node, the checksum of this check node can be computed. A higher order energy $E_v^{(l>1)}$ is computed for this variable node only when the value of the checksum is small (e.g., smaller than a predefined value). Otherwise, only the lower order energy $E_v^{(l=1)}$ is computed for this variable node. Whether to compute a higher order $E_v^{(l>1)}$ energy for a variable node v can be indicated with a higher-order information flag $hoif_v$, where a "1" may indicate that the higher order $E_v^{(l>1)}$ computation is needed; and a "0" indicates otherwise. An array hoif can be used for the different variable nodes.

In other words, one way to reduce the hardware complexity of higher-order information includes using the higher order energies $E_v^{(l>1)}$ on limited cycles of decoding. To do this array hoif is used to identify in which decoding cycles and for which set of variable nodes to use the higher order energies $E_v^{(l>1)}$.

Figure 6:
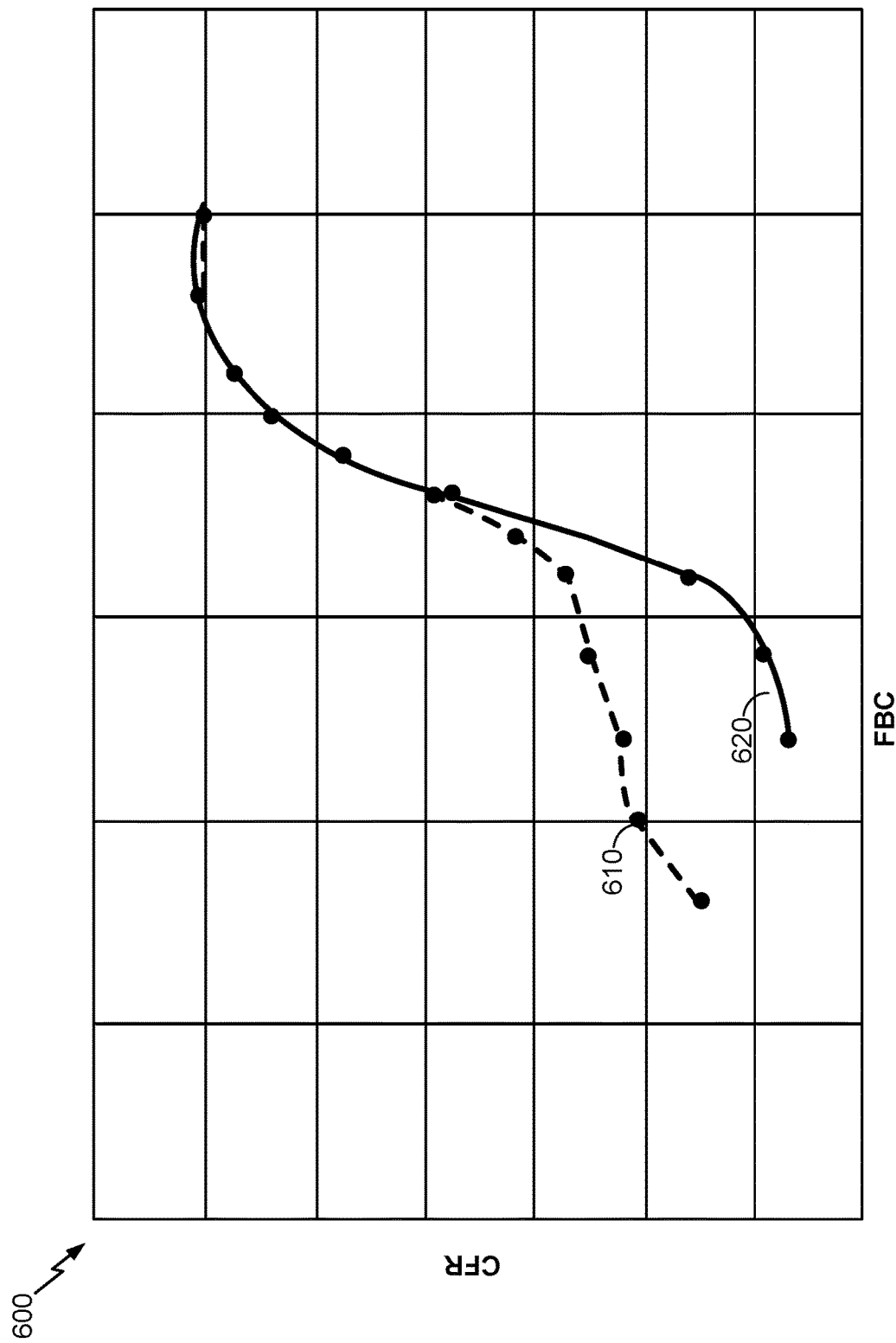
FIG. 6 illustrates an example error floor of a decoder using the higher order information disclosed in connection with FIG. 5.

FIG. 6 illustrates an example error floor of a decoder using the higher order information disclosed in connection with FIG. 5. Like the plot 400 of FIG. 4, the plot 600 illustrated in FIG. 6 shows the FBC on the horizontal axis and the CFR on the vertical axis and is generated based on two simulations of decoding QC-LDPC codes, each resulting in a curve. A first simulation uses for a variable node a lower order energy $E_v^{(l=1)}$ of the variable node in the related BF decision, and corresponds to a first curve 610 (which is the same curve shown in the plot 400 of FIG. 4). Its error floor occurs starting at CFR close to $10^{-3}$. A second simulation additionally uses for a variable node a higher order energy $E_v^{(l>1)}$ of the variable node in the related BF decision (where l is three for the indirectly connected check nodes), and corresponds to a second curve 629. Its error floor occurs starting at CFR close to $10^{-5}$. Thus, by using the higher order energy $E_v^{(l>1)}$, the error floor is reduced by about two orders of magnitude, which, in turn, significantly improves the decoding performance.

Figure 7:
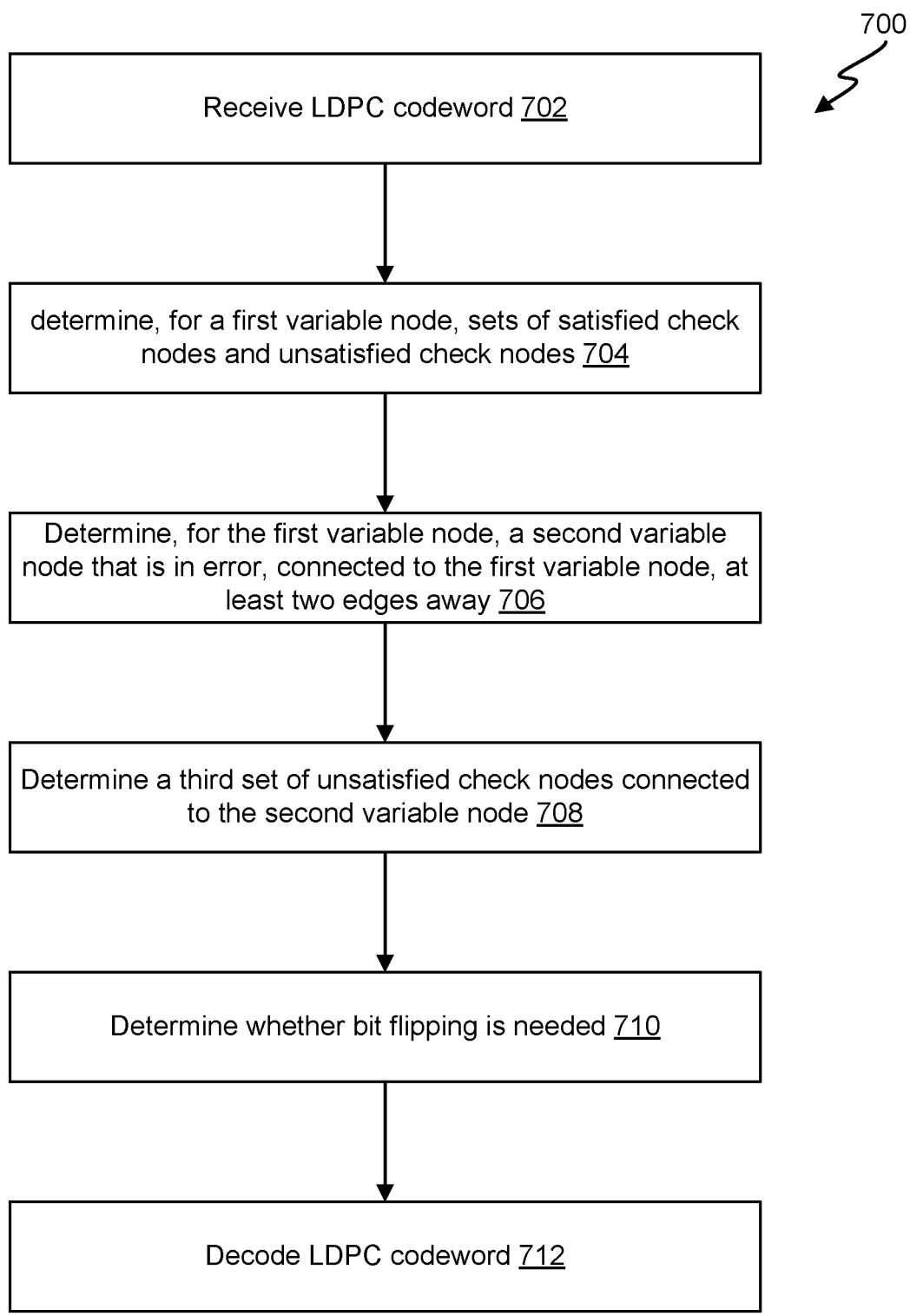
FIG. 7 illustrates an example flow for codeword decoding based on higher order information, in accordance with certain embodiments of the present disclosure.
Figure 8:
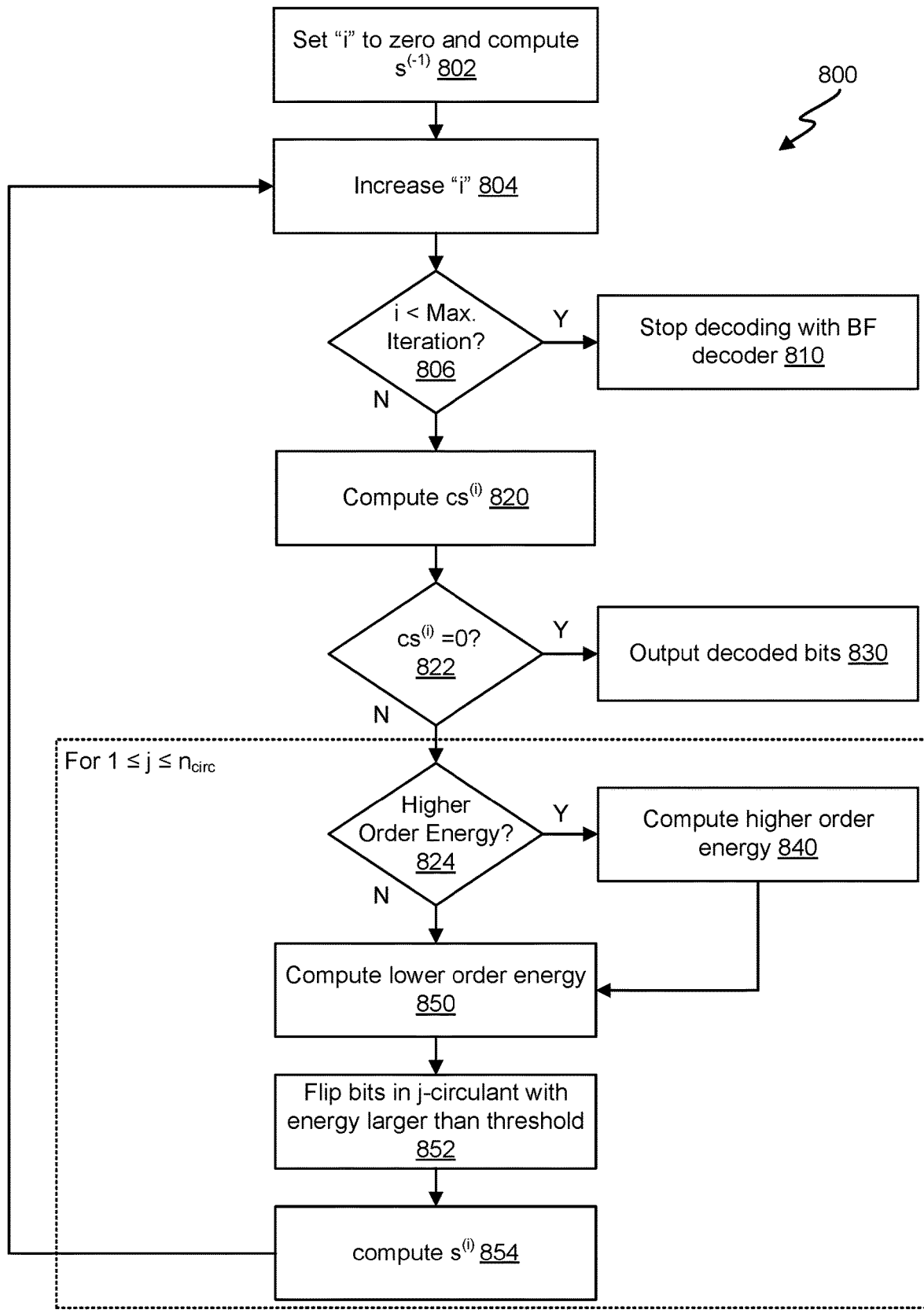
FIG. 8 illustrates a more detailed example flow for LDPC codeword decoding based on higher order information, in accordance with certain embodiments of the present disclosure.

FIGS. 7-8 illustrate example flows for decoding codewords using, in part, higher order information. A computer system that includes an ECC decoder, such as an LDPC decoder, is described as performing particular operations of the example flows. This system is an example of the error-correction system 100 of FIG. 1. In an example, the computer system includes one or more processors and one or more memories. The memory(ies) stores computer-readable instructions to embody functionalities specific to the computer system. The instructions when executed by the processor(s) of the computer system result in performance of the functionalities by the computer system. The instructions stored in the memory(ies) in conjunction with the underlying processor(s) represents a means for performing the functionalities. Although the operations are illustrated in a particular order, other arrangements of the operations are possible and some of the operations may be skipped as it would be apparent to a person skilled in the art.

FIG. 7 illustrates an example flow 700 for codeword decoding based on higher order information, in accordance with certain embodiments of the present disclosure. To clarify, the flow 700 is described in connection with a decoding of a variable node and reference is made to the elements of FIGS. 3 and 5. However, the flow 700 similarly applies to the iterative decoding of this variable node and other variable nodes, where the higher order information can span multiple, indirectly-connected variable nodes at one or more distances and/or multiple, indirectly-connected check nodes at one or more distances.

As illustrated, the flow 700 includes operation 702, where the computer system receives an LDPC codeword. In an example, the LDPC codeword is accessed from data storage. In another example, the LPDC codeword is received in data transmission. In both examples, the LDPC codeword can be a QC-LDPC codeword.

The flow 700 also includes operation 704, where the computer system determines for a first variable node (e.g., the variable node 310 or 510) sets of satisfied check nodes and unsatisfied check nodes. In an example, a first set (e.g., the set 320) is determined and corresponds to check nodes that are satisfied and that are directly connected to the first variable node (e.g., at a distance of one). A second set (e.g., the set 330) is also determined and corresponds to check nodes that are unsatisfied and that are directly connected to the first variable node. The degree of the first variable node can be equal to the sum of the size of the first set and the size of the second set (e.g., the total number of directly connected check nodes). The lower order energy of the first variable node can be equal to the size of the second set (e.g., the total number of directly connected, unsatisfied check nodes). The first variable node can be in error when the lower order energy is not equal to zero (e.g., the first variable node is directly connected to at least one unsatisfied check node).

The flow 700 also includes operation 706, where the computer system determines for the first variable node a second variable node (e.g., the variable node 540*a*) that is in error, connected to the first variable node, and at least two edges away from the first variable node. In an example, the second variable node is indirectly connected to the first variable node along a path that has a distance l, where this path includes a satisfied check node from the first set (e.g., the check node 520*a*).

The flow 700 also includes operation 708, where the computer system determines a third set of unsatisfied check nodes (e.g. the set $C_v^{(3)}$ 550) that are connected to the second variable node. A check node (e.g., the check node 550*a*) from this third set is unsatisfied, is indirectly connected to the first variable node along a path that has a distance l+1, where this path includes the satisfied check node from the first set (e.g., the check node 520*a*) and the second variable node (e.g., the variable node 540*a*).

The flow 700 also includes operation 710, where the computer system determines whether at least one bit represented by the first variable node is to be flipped. This determination can be based on the second set and the third set. For instance, a lower order energy of the first variable node can be computed as a function of the size of the second set (e.g., equal to the total number of directly connected, unsatisfied nodes). A higher order energy of the first variable node can be computed as a function of the size of the third set (e.g., equal to the total number of unsatisfied nodes of the third set). A total energy of the first variable node can be computer as a function of the two energies (e.g., as a sum or a weighted sum of the lower order energy and higher order energy). The total energy can be computed to a threshold that is defined based on the degree of the first variable node (e.g., half of the degree). If the total energy is larger than the threshold, the at least one bit is to be flipped; otherwise, the at least one bit is not to be flipped.

In an example and for optimization purposes, the lower order energy may be computed, whereas the higher order energy may be selectively computed. For instance, in a current decoding iteration, the checksum of a check node that is directly connected to the first variable node and that is unsatisfied is computed. If the checksum is small (e.g., its value smaller than a predefined value), then the higher order energy is computed. Otherwise, this energy is not computed. Of course, as the checksum changes between iterations, the decision to compute or not the higher order energy can also change accordingly. For instance, in the current decoding iteration, the value of the checksum is small and as a result, the higher order energy is computed. In another decoding iteration, an updated value of the checksum is determined and is larger than the predefined value. In this case, the computation of the higher order energy is omitted. Accordingly, the determination of the second variable node is omitted. Similarly, the determination of the third set is omitted. Instead, only updated lower order energy is computed. Accordingly, an updated second set of check nodes that are directly connected to the first variable node and that are unsatisfied is determined. The bit flopping decisions are based on this updated second set and is performed independently of the third set. For instance, the size of the updated second set represents the total energy of the first variable node in this decoding iteration and is compared to the threshold.

The flow 700 also includes operation 712, where the computer system decodes the LDPC codeword based on the determination at operation 710 of whether the at least one bit is to be flipped. For example, if the determination at operation 710 is to flip the at least one bit, the bit(s) is(are) flipped, the checksum of the LDPC codeword is updated, soft information is updated, and another decoding iteration is performed as applicable (e.g., the checksum is not zero and the maximum number of iteration is not reached). If the decoding fails (e.g., the checksum is not zero and the maximum number of iteration is reached), the decoding can be attempted again by another decoder with a higher error-correction capability (e.g., an MS decoder).

FIG. 8 illustrates a more detailed example flow 800 for LDPC codeword decoding based on higher order information, in accordance with certain embodiments of the present disclosure. An LDPC codeword is decoded by using a BF decoder of the computer system. Operations of the flow 800 can be implemented as sub-operations of some or all of the operations of the flow 700. In the flow 800, "i" represents the counter tracking of the decoding iteration (e.g., the value of the counter represents the number of the decoding iteration). Assuming i ($0 \leq i \leq i_{max}$), $d_j^i$ denotes the decision of variable node j at the i-th iteration and $d^{(i)}=[d_0^{(i)}, d_1^{(i)}, \ldots, d_{N-1}^{(i)}]$. Suppose $d^{(-1)}=[D_0^{(-1)}, D_1^{(-1)}, \ldots, d_{N-1}^{(-1)}]=y$ (e.g., the decision before the start of the decoding iteration). $s^{(i)}=[d_0^{(i)}, d_1^{(i)}, \ldots d_{N-1}^{(i)}] \cdot H^T$ represents syndrome at iteration i. $cs^{(i)}=\|s^{(i)}\|$ represents the checksum of the LDPC codeword iteration i. Let $cs_{th}$ be the checksum threshold for computing a higher order energy function at a distance of at least two. Let hoif denote an array of higher-order information flags which identifies which energy function should be used based on the checksum threshold $cs_{th}$. As illustrated in FIG. 8, the flow 800 represents the following steps:

Step 0: Set i=0, calculate $s^{(-1)}$ and go to step 1;
Step 1: i=i+1, if reach max iteration, stop decoding. Otherwise, go to step 2;
Step 2: if $cs^{(i)}=0$, stop decoding. Otherwise, go to step 3;
Step 3: For $1 \leq j \leq n_{circ}$,
  If (hoif (i, j)==1):
  Compute energy for each using $E_v=E_v^{(l>1)}$,
  Otherwise:
  Compute energy for each using $E_v=E_v^{(l=1)}$,
  Flip those bits in j-circulant that $E_v > T_v$ (e.g., in the case of a QC-LDPC codeword),
  Compute and update $s^{(i)}$;
Go to step 1.

As illustrated, the flow 800 starts at operation 802, where the computer system sets the counter "i" to zero and computes the syndrome $s^{(-1)}$. The flow 800 also includes operation 804, where the computer system increases the counter "i" (e.g., i=i+1).

The flow 800 also includes operation 806, where the computer system determines whether the counter "i" has reached the maximum number of decoding iteration (e.g., $i=i_{max}$). If so, operation 810 follows operation 806. Otherwise, operation 820 is performed.

The flow 800 also includes operation 810, where the computer system stops decoding the LDPC codeword with the BF decoder. At this operation, if the checksum $cs^{(i_{max})}$ is equal to zero, the decoding is successful. Otherwise, the decoding has failed and another LDPC decoder with a higher error-correction capability (e.g., an MS decoder) can be used in another attempt to decode the LDPC codeword.

The flow 800 also includes operation 820, where the computer system computes the checksum $cs^{(i)}$. The flow 800 also includes operation 822, where the computer system compares the checksum $cs^{(i)}$ to zero. If the checksum $cs^{(i)}$ is equal to zero, operation 830 follows operation 822. Otherwise, operation 824 follows operation 822.

The flow 800 also includes operation 830 where the computer system outputs the decoded bits. Because the checksum $cs^{(i)}$ of the LDPC codeword at the i-th decoding iteration is zero, the decoding is successful and additional decoding iterations are no longer needed.

The flow 800 also includes operations 824-854. These operations can be repeated for the different variable nodes. In the case of a QC-LDPC code with $n_{cir}$ circulant matrices, the decoding can be repeated for the different circular matrices j, where $0 \leq j \leq n_{cir}$. At operation 824, the checksum $cs^{(i)}$ of the LDPC codeword at the i-th decoding iteration is not zero. In this operation, the computer system determines whether to compute a higher order energy for a variable node (with index j, where this variable node can correspond to a circular matrix j in the case of a QC-LDPC codeword). The determination can be based on the value of the flag in the hoif array. If hoif (i, j) is equal to one, the higher order energy is to be computed and operation 840 follows operation 824. Otherwise, the computation of a lower order energy is sufficient and the operation 850 follows operation 824.

The flow 800 also includes operation 840, where the computer system computes the higher order energy for the variable node. For example, the higher order energy is $E_v^{(l>1)}$.

The flow 800 also includes operation 850, where the computer system computes the lower order energy for the variable node. For example, the lower order energy is $E_v^{(l=1)}$. In the illustration of FIG. 8, operation 850 also follows operation 840 such, when the higher order energy is computed, this energy can be combined with the lower order energy to determine a total energy of the variable node.

The flow 800 also includes operation 852, where the computer system flips one or more bits of the variable node (or of j-th circulant matrix in the case a QC-LDPC code) when the total energy is larger than a threshold. The flow 800 also includes operation 854, where the computer system computes an updated $s^{(i)}$ following the BF. Operation 854 loops back to operation 804 when j becomes equal to $n_{circ}$.

Figure 9:
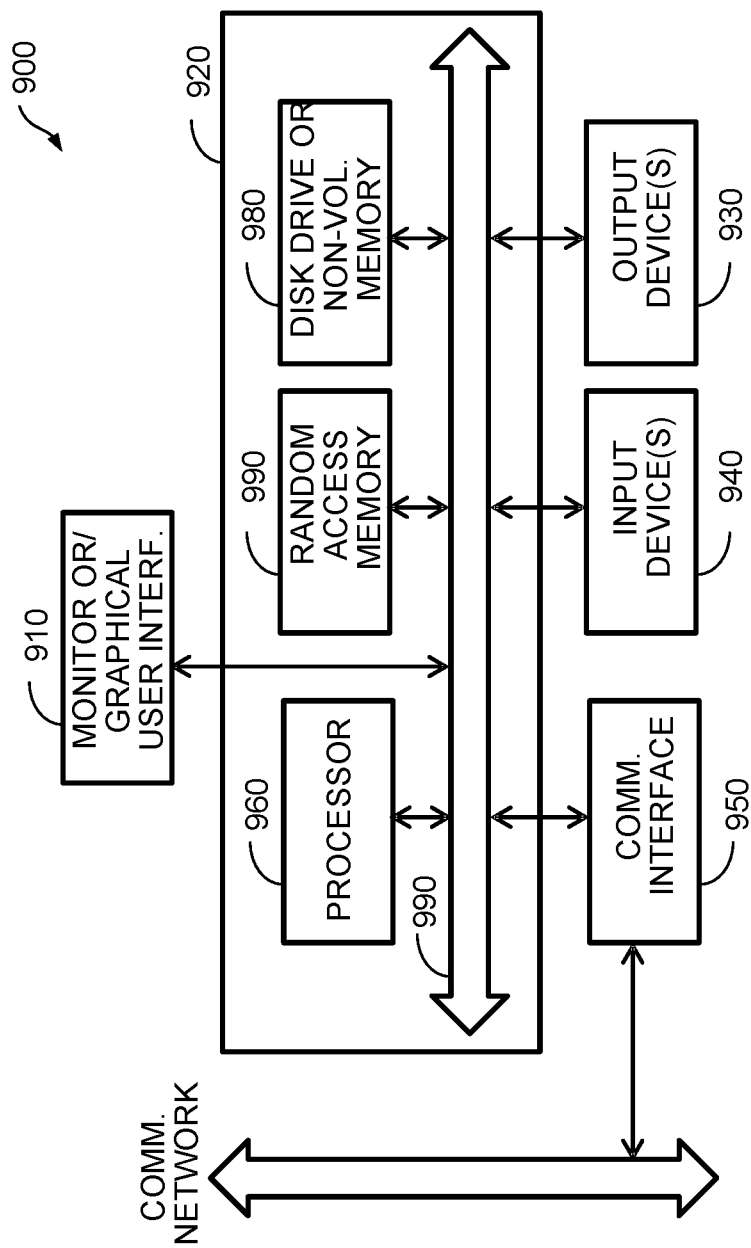
FIG. 9 is representative of a computer system capable of embodying the present disclosure.

FIG. 9 is representative of a computer system 900 capable of embodying the present disclosure. FIG. 9 is merely illustrative of an embodiment of the present disclosure and does not limit the scope of the disclosure as recited in the claims. In one embodiment, the system is a computer system 900 that typically includes a monitor 910, a computer 920, user output devices 930, user input devices 940, communications interface 950, and the like. The error-correction system 100 of FIG. 1 implements some or all of the components of the computer system 900.

As shown in FIG. 9, the computer 920 may include a processor(s) 960 that communicates with a number of peripheral devices via a bus subsystem 990. These peripheral devices may include the user output devices 930, the user input devices 940, the communications interface 950, and a storage subsystem, such as random access memory (RAM) 970 and disk drive 980.

The user input devices 940 include all possible types of devices and mechanisms for inputting information to the computer system 920. These may include a keyboard, a keypad, a touch screen incorporated into the display, audio input devices such as voice recognition systems, microphones, and other types of input devices. In various embodiments, the user input devices 940 are typically embodied as a computer mouse, a trackball, a track pad, a joystick, a wireless remote, a drawing tablet, a voice command system, an eye tracking system, and the like. The user input devices 940 typically allow a user to select objects, icons, text and the like that appear on the monitor 910 via a command, such as a click of a button or the like.

The user output devices 930 include all possible types of devices and mechanisms for outputting information from the computer 920. These may include a display (e.g., the monitor 910) and non-visual displays, such as audio output devices, etc.

The communications interface 950 provides an interface to other communication networks and devices. The communications interface 950 may serve as an interface for receiving data from and transmitting data to other systems. Embodiments of the communications interface 950 typically include an Ethernet card, a modem (telephone, satellite, cable, ISDN), (asynchronous) digital subscriber line (DSL) unit, FireWire interface, USB interface, and the like. For example, the communications interface 950 may be coupled to a computer network, to a FireWire bus, or the like. In other embodiments, the communications interfaces 950 may be physically integrated on the motherboard of the computer 920, and may be a software program, such as soft DSL or the like.

In various embodiments, the computer system 900 may also include software that enables communications over a network such as the HTTP, TCP/IP, RTP/RTSP protocols and the like. In alternative embodiments of the present disclosure, other communications software and transfer protocols may also be used, for example IPX, UDP or the like. In some embodiments, the computer 920 includes one or more Xeon microprocessors from Intel as the processor(s) 960. Further, in one embodiment, the computer 920 includes a UNIX-based operating system.

The RAM 970 and the disk drive 980 are examples of tangible media configured to store data such as embodiments of the present disclosure, including executable computer code, human readable code or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 970 and the disk drive 980 may be configured to store the basic programming and data constructs that provide the functionality of the present disclosure.

Software code modules and instructions that provide the functionality of the present disclosure may be stored in the RAM 970 and the disk drive 980. These software modules may be executed by the processor(s) 960. The RAM 970 and the disk drive 980 may also provide a repository for storing data used in accordance with the present disclosure.

The RAM 970 and the disk drive 980 may include a number of memories including a main random access memory (RAM) for storage of instructions and data during program execution and a read-only memory (ROM) in which fixed non-transitory instructions are stored. The RAM 970 and the disk drive 980 may include a file storage subsystem providing persistent (non-volatile) storage for program and data files. The RAM 970 and the disk drive 980 may also include removable storage systems, such as removable flash memory.

The bus subsystem 990 provides a mechanism for letting the various components and subsystems of the computer 920 communicate with each other as intended. Although the bus subsystem 990 is shown schematically as a single bus, alternative embodiments of the bus subsystem may utilize multiple busses.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc., and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable, non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media now known or later developed that are capable of storing code and/or data. Hardware modules or apparatuses described herein include, but are not limited to, ASICs, FPGAs, dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method of decoding a low-density parity-check (LDPC) codeword, the method implemented by a computer system and comprising:
   determining, for a first variable node, a first set of one or more check nodes that are connected to the first variable node and that have parity check satisfied, and a second set of one or more check nodes that are connected to the first variable node and that have parity check unsatisfied, wherein the first variable node represents at least one bit of the LDPC codeword and is in error, the at least one bit corresponding to data being used by the computing system;

determining, for the first variable node, a second variable node that is in error, connected to the first variable node via a check node of the first set, and at least two edges away from the first variable node;

determining a third set of one or more check nodes that are connected to the second variable node and that have parity check unsatisfied;

determining a bit-flipping decision on the at least one bit represented by the first variable node based on the second set and the third set;

decoding the LDPC codeword based on the bit-flipping decision of the at least one bit; and correcting the data being used by the computing system based on the decoding of the LDPC codeword.

2. The method of claim 1, further comprising:
determining, in a decoding iteration, a checksum associated with the first variable node.

3. The method of claim 2, further comprising:
in another decoding iteration:
  omitting the determination of the second variable node;
  determining an updated second set of one or more check nodes that are connected to the first variable node and that have parity check unsatisfied;
  determining an updated bit-flipping decision on the at least one bit represented by the first variable node based on the updated second set and independently of the third set; and
  decoding the LDPC codeword based on the updated bit-flipping decision of the at least one bit.

4. The method of claim 1, wherein determining the bit-flipping decision comprises:
determining a total number of unsatisfied check nodes based on a size of the second set and a size of the third set; and
comparing the total number to a threshold value.

5. The method of claim 4, wherein the threshold value is defined based on a degree of the first variable node, and wherein determining the bit-flipping decision comprises determining that the at least one bit is to be flipped based on the total number being larger than the threshold value.

6. The method of claim 1, wherein determining the bit-flipping decision comprises:
in a decoding iteration:
  determining a first energy $E_v^{(l>1)}$ of the first variable node, wherein:
    the first energy $E_v^{(l>1)}$ is equal to $$\sum_{i=0}^{deg_v} g(c_i^{(1)}, C_i^{(l>1)}),$$

$deg_v$ is a degree of the first variable node,
  $c_i^{(1)}$ is a check node from the second set and that has an index i,
  $C_i^{(l>1)}$ is a fourth set of check nodes that are unsatisfied, that are at least l edges away from the first variable node, and that each is connected to a variable node from a set $S_v^{(l-1)}$ of variable nodes, l is at least three, the set $S_v^{(l-1)}$ comprises variable nodes that are in error and that are at least l–1 edges away from the first variable node, and $g(c_i^{(1)}, C_i^{(l)}) = \text{NOT}(c_i^{(1)}) \text{AND}(\text{OR}(C_i^l))$; and updating an energy $E_v$ of the first variable node based on the first energy $E_v^{(l>1)}$, and comparing the energy $E_v$ to a threshold value, wherein the threshold value is defined based on a degree of the first variable node.

7. The method of claim 6, further comprising:
in another decoding iteration, determining whether the at least one bit is flipped by at least:
determining, instead of the first energy $E_v^{(l>1)}$, a second energy $E_v^{(l=1)}$ of the first variable node, wherein the energy $E_v$ is equal to the second energy $E_v^{(l=1)}$; and
comparing the energy $E_v$ to the threshold value.

8. The method of claim 7, wherein the second energy $E_v^{(l=1)}$ is computed instead of the first energy $E_v^{(l>1)}$ based on a checksum associated with the first variable node.

9. A computer system comprising:
a memory storing a low-density parity-check (LDPC) codeword; and
an LDPC decoder coupled with the memory and configured to:
  determine, for a first variable node, a first set of one or more check nodes that are connected to the first variable node and that have parity check satisfied and a second set of one or more check nodes that are connected to the first variable node and that have parity check unsatisfied, wherein the first variable node represents at least one bit of the LDPC codeword and is in error, the at least one bit corresponding to data being used by the computing system;
  determine, for the first variable node, a second variable node that is in error, connected to the first variable node via a check node of the first set, and at least two edges away from the first variable node;
  determine a third set of one or more check nodes that are connected to the second variable node and that have parity check unsatisfied;
  determine a bit-flipping decision on the at least one bit represented by the first variable node based on the second set and the third set; and
  decode the LDPC codeword based on the bit-flipping decision of the at least one bit, wherein the data being used by the computing system is corrected based on the decoding of the LDPC codeword.

10. The computer system of claim 9, wherein the LDPC decoder is further configured to:
determine, in a decoding iteration, a checksum associated with the first variable node.

11. The computer system of claim 10, wherein the LDPC decoder is further configured to:
in another decoding iteration:
  omit the determination of the second variable node;
  determine an updated second set of one or more check nodes that are connected to the first variable node and that have parity check unsatisfied;
  determine an updated bit-flipping decision on the at least one bit represented by the first variable node based on the updated second set and independently of the third set; and
  decode the LDPC codeword based on the updated bit-flipping decision of the at least one bit.

12. The computer system of claim 9, wherein determining the bit-flipping decision comprises:

determining a total number of unsatisfied check nodes based on a size of the second set and a size of the third set; and comparing the total number to a threshold value.

13. The computer system of claim 12, wherein the threshold value is defined based on a degree of the first variable node, and wherein determining the bit-flipping decision comprises determining that the at least one bit is to be flipped based on the total number being larger than the threshold value.

14. The computer system of claim 9, wherein determining the bit-flipping decision comprises:

in a decoding iteration:
  determining a first energy $E_v^{(l>1)}$ of the first variable node, wherein:
    the first energy $E_v^{(l>1)}$ is equal to $$\sum_{i=0}^{deg_v} g(c_i^{(1)}, C_i^{(l>1)}),$$

$deg_v$ is a degree of the first variable node,
  $c_i^{(1)}$ is a check node from the second set and that has an index i,
  $C_i^{(l>1)}$ is a fourth set of check nodes that are unsatisfied, that are at least l edges away from the first variable node, and that each is connected to a variable node from a set $S_v^{(l-1)}$ of variable nodes,
  l is at least three,
  the set $S_v^{(l-1)}$ comprises variable nodes that are in error and that are at least l−1 edges away from the first variable node, and $g(c_i^{(1)}, c_i^{(l)}) = \text{NOT}(c_i^{(1)}) \text{AND}(\text{OR}(c_i^j))$; and updating an energy $E_v$ of the first variable node based on the first energy $E_v^{(l>1)}$; and comparing the energy $E_v$ to a threshold value, wherein the threshold value is defined based on a degree of the first variable node.

15. The computer system of claim 14, wherein the LDPC decoder is further configured to:

in another decoding iteration, determine whether the at least one bit is to be flipped by at least:
  determining, instead of the first energy $E_v^{(l>1)}$, a second energy $E_v^{(l=1)}$ of the first variable node, wherein the energy $E_v$ is equal to the second energy $E_v^{(l=1)}$; and
  comparing the energy $E_v$ to the threshold value.

16. The computer system of claim 15, wherein the second energy $E_v^{(l=1)}$ is computed instead of the first energy $E_v^{(l>1)}$ based on a checksum associated with the first variable node.

17. A non-transitory computer readable storage medium storing instructions, that upon execution on a computer system, cause the computer system to perform operations comprising:

determining, for a first variable node, a first set of one or more check nodes that are connected to the first variable node and that have parity check satisfied and a second set of one or more check nodes that are connected to the first variable node and that have parity check unsatisfied, wherein the first variable node represents at least one bit of a low-density parity-check (LDPC) codeword and is in error, the at least one bit corresponding to data being used by the computing system;

determining, for the first variable node, a second variable node that is in error, connected to the first variable node via a check node of the first set, and at least two edges away from the first variable node;

determining a third set of one or more check nodes that are connected to the second variable node and that have parity check unsatisfied;

determining a bit-flipping decision on the at least one bit represented by the first variable node based on the second set and the third set;

decoding the LDPC codeword based on the bit-flipping decision of the at least one bit; and correcting the data being used by the computing system based on the decoding of the LDPC codeword.

18. The non-transitory computer readable storage medium of claim 17, wherein the operations further comprise:

determining, in a decoding iteration, a checksum associated with the first variable node.

19. The non-transitory computer readable storage medium of claim 18, wherein the operations further comprise:

in another decoding iteration:
  omitting the determination of the second variable node;
  determining an updated second set of one or more check nodes that are connected to the first variable node and that have parity check unsatisfied;
  determining an updated bit-flipping decision on the at least one bit represented by the first variable node based on the updated second set and independently of the third set; and
  decoding the LDPC codeword based on the updated bit-flipping decision of the at least one bit.

20. The non-transitory computer readable storage medium of claim 17, wherein determining the bit-flipping decision comprises:

determining a total number of unsatisfied check nodes based on a size of the second set and a size of the third set; and comparing the total number to a threshold value, wherein the threshold value is defined based on a degree of the first variable node.

* * * * *